(12) United States Patent
Suzuki et al.

(10) Patent No.: US 8,337,267 B2
(45) Date of Patent: Dec. 25, 2012

(54) ORGANIC EL DEVICE WITH FILTER AND METHOD OF REPAIRING SAME

(75) Inventors: Noriyuki Suzuki, Osaka (JP); Shinsuke Komatsu, Osaka (JP); Akihisa Nakahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 45 days.

(21) Appl. No.: 12/988,659

(22) PCT Filed: Nov. 25, 2009

(86) PCT No.: PCT/JP2009/006351
§ 371 (c)(1),
(2), (4) Date: Oct. 20, 2010

(87) PCT Pub. No.: WO2010/061591
PCT Pub. Date: Jun. 3, 2010

(65) Prior Publication Data
US 2011/0037377 A1     Feb. 17, 2011

(30) Foreign Application Priority Data

Nov. 27, 2008   (JP) .................................. 2008-302079

(51) Int. Cl.
*H01J 9/50*   (2006.01)
(52) U.S. Cl. ............ 445/2; 313/498; 313/504; 313/506; 313/112
(58) Field of Classification Search .......... 313/498–512, 313/110, 112, 113; 445/2; 438/4
See application file for complete search history.

(56) References Cited

U.S. PATENT DOCUMENTS
2001/0043043 A1 * 11/2001 Aoyama et al. ............... 313/506
(Continued)

FOREIGN PATENT DOCUMENTS
EP           1 476 000        11/2004
(Continued)

OTHER PUBLICATIONS

English translation of International Preliminary Report on Patentability and Written Opinion of the International Searching Authority, issued Jul. 14, 2011 in PCT/JP2009/006351.

(Continued)

*Primary Examiner* — Anh Mai
*Assistant Examiner* — Kevin Quarterman
(74) *Attorney, Agent, or Firm* — Wenderoth, Lind & Ponack, L.L.P.

(57) ABSTRACT

There are provided an organic electro-luminescence device with filters and a method for repairing the same which are capable of reducing variations in conditions for leak-light transmission during leak-light detection and conditions for transmission of laser light used for repairing, depending on respective types of filters. An organic electro-luminescence device with a filter includes a first electrode in a side for extraction of light to outside; a second electrode placed oppositely to the first electrode; an electro-luminescence layer placed between the first electrode and the second electrode; a filter provided on a surface of the first electrode, the surface of the first electrode being opposite to another surface of the first electrode facing to the electro-luminescence layer, wherein the filter is adapted to transmit, therethrough, light in a certain-wavelength range out of the range of 400 nm to 700 nm; and a certain-wavelength absorption film placed between the filter and the electro-luminescence layer, wherein the certain-wavelength absorption film has a transmittance for light in the certain-wavelength range out of the range of 400 nm to 700 nm lower than its transmittance for light with wavelengths of 400 nm to 700 nm, wherein the certain-wavelength absorption film is adapted to absorb light in the certain-wavelength range.

4 Claims, 9 Drawing Sheets

U.S. PATENT DOCUMENTS

| | | | |
|---|---|---|---|
| 2002/0142697 A1 | 10/2002 | Yamagata et al. | |
| 2005/0023523 A1 | 2/2005 | Kawaguchi et al. | |
| 2005/0062406 A1 | 3/2005 | Kinoshita | |
| 2005/0116619 A1* | 6/2005 | Kuma et al. | 313/503 |
| 2005/0196892 A1 | 9/2005 | Yamagata et al. | |
| 2005/0225233 A1* | 10/2005 | Boroson et al. | 313/504 |
| 2008/0203898 A1* | 8/2008 | Kobayashi | 313/498 |
| 2009/0096359 A1* | 4/2009 | Lee et al. | 313/504 |
| 2010/0233931 A1 | 9/2010 | Yamagata et al. | |

FOREIGN PATENT DOCUMENTS

| | | |
|---|---|---|
| JP | 2002-260857 | 9/2002 |
| JP | 2004-296403 | 10/2004 |
| JP | 2005-32576 | 2/2005 |
| JP | 2006-323032 | 11/2006 |
| JP | 2007-103028 | 4/2007 |
| JP | 2008-235177 | 10/2008 |

OTHER PUBLICATIONS

International Search Report issued Mar. 9, 2010 in International (PCT) Application No. PCT/JP2009/006351.

"'94 Market of Liquid Crystal Display Peripheral Material and Chemicals," CMC Corporation, Jun. 1994, (the first printing published) (with English translation).

Extended European Search Report issued Aug. 31, 2012 in corresponding European Application No. 09828841.8.

* cited by examiner

ORGANIC EL DEVICE WITH FILTER AND METHOD OF REPAIRING SAME

BACKGROUND

1. Technical Field

The present invention relates to an organic electro-luminescence (EL) device with filter including an organic EL element and, also, a method of repairing the same.

2. Background Art

In recent years, organic EL displays have been regarded as being usable as display devices. An organic EL display is constituted by an organic EL element having characteristics such as low-voltage driving, self-light-emission, and high-speed response. Such an organic EL display is of a self-light-emission type, which eliminates the necessity of provision of a back light which is required in a liquid crystal display, thereby enabling reduction of the product thickness, power consumption and cost.

Herein, a structure of the organic EL display will be described simply.

FIG. 6 is a schematic cross-sectional view illustrating the structure of a conventional organic EL display. In FIG. 6, an anode 2, an EL layer 3, and a cathode 4 are formed on a glass substrate 1 in which the respective components are formed thereon in the mentioned order. The EL layer 3 contains an organic compound having the function of emitting light by being supplied with a voltage or by being supplied with external energy such as UV light. Further, the EL layer 3 emits light in any light-emission color, such as red, green, and blue colors, by being supplied with external energy. In addition thereto, in some cases, there may be provided a color filter 5 for improving the color-creation ability of the display. As illustrated in FIG. 6, an organic EL display 6 is structured.

Subsequently, light emission from the organic EL display 6 will be described. When a direct-current voltage is applied between the two electrodes (between the anode 2 and the cathode 4), holes 7 and electrons 8 are supplied to the EL layer 3. Holes 7 and electrons 8 combine with each other in the EL layer 3 to generate energy, which excites electrons in the organic compound contained in the EL layer 3. When the excited electrons are brought into a ground state, they emit energy as light to the outside, which causes the EL layer 3 to emit light. Therefore, in order to cause the EL layer 3 to emit light uniformly, it is necessary that holes 7 and electrons 8 are uniformly supplied to the EL layer 3.

An interval L between the anode 2 and the cathode 4 is about 1 micrometer and therefore is significantly narrow, thereby forming a fine structure. Therefore, in cases where the thicknesses of the electrodes (the anode 2 and the cathode 4) are non-uniform or a foreign substance is intruded between the electrodes, the EL layer 3 may be caused to have portions having non-uniform thicknesses, during the processing for fabricating the organic EL display 6. In such cases, the EL layer 3 has lower electric resistances at its portions with smaller thicknesses and, therefore, holes 7 and electrons 8 are actively supplied thereto, which induces leak currents for making the light emission from the EL layer 3 non-uniform, thereby inducing non-uniform pixels.

Further, in cases where the foreign substance 9 is large, complete conduction (a short-circuit) is established between the anode 2 and the cathode 4 due to bite and the like of the foreign substance 9 therebetween, which prevents the occurrence of combination of holes 7 and electrons 8 in the EL layer 3, thereby causing the EL layer 3 to perform no light emission to induce non-lighting pixels (hereinafter, referred to as extinct points).

If a plurality of non-uniform pixels and extinct points are induced in the organic EL display 6, this significantly degrades the image quality and the display quality of the display, which makes it impossible to make a shipment of the product. In order to address this, it is necessary to find and repair non-uniform pixels and extinct points. As a repairing method therefor, there is a method which, at first, detects weak leak light generated from an organic EL display as a result of application of a reverse-bias voltage thereto and, then, burns off the electrodes at the periphery thereof.

There will be described a case of detecting, through color filters, weak leak light generated as a result of application of such a reverse-bias voltage, with reference to FIG. 7.

FIG. 7 is a conceptual view of weak leak-light detection through conventional color filters. Referring to FIG. 7, when a reverse-bias voltage from a power supply 10 is applied to an anode 4 and a cathode 4 on a glass substrate 1, leak light 12 is generated from a current-leak generating portion 11. The leak light 12 passes through a color filter 5 and, thereafter, is detected by a weak-light detection camera 13. The detection of leak light from an organic EL display 6 having color filters is performed on pixels (hereinafter, referred to as red-filter pixels, green-filter pixels, and blue-filter pixels) through respective color filters for a red color, a green color, and a blue color.

Next, there will be described, in detail, light transmittance characteristics of color filters. It is assumed that there are provided the same anode, the same cathode, the same EL layer, the same glass substrate, and the same power supply, for each of the red-filter pixels, the green-filter pixels, and the blue-filter pixels. Further, it is assumed that, when the same reverse-bias voltage is applied thereto, the red-filter pixels, the green-filter pixels, and the blue-filter pixels induce respective current-leak generating portions, such that the current-leak generating portions in the respective pixels have the same area and the same leak light intensity. Even in this case, the red color filter, the green color filter, and the blue color filter have different light transmittance characteristics and, therefore, the leak lights passed through the respective color filters have different light intensities and different spectra.

Hereinafter, transmittance characteristics of a red color filter, a green color filter, and a blue color filter will be described, by exemplifying liquid-crystal-intended color filters.

FIG. 8A is a view illustrating a spectral transmittance characteristic of Toptical as shown in "'94 Market of Liquid-crystal Display Peripheral Materials and Chemicals", CMC Corporation, Jun. 20, 1994 (the first printing published), and FIG. 8B is a view illustrating a CIE chromaticity of TOPTICAL, as shown in "'94 Market of Liquid-crystal Display Peripheral Materials and Chemicals", CMC Corporation, Jun. 20, 1994 (the first printing published). FIG. 9 is a view illustrating a spectral transmittance characteristic of a color-filter pigment-dispersed type resist, as shown in "'94 Market of Liquid-crystal Display Peripheral Materials and Chemicals", CMC Corporation, Jun. 20, 1994 (the first printing published).

As illustrated in FIG. 8A, the display-intended color filters have precise specifications around the wavelengths to be passed therethrough, but their characteristics are varied in other regions. Weak light emission from the EL layer is induced by current leak and, therefore, exhibits a spectrum including a near-infrared range, as disclosed in Japanese Patent Laid-open Publication No. 2006-323032. Accordingly, their characteristics in longer-wavelength ranges are important. In comparing between FIGS. 8A and 8B and FIG. 9, at a maximum wavelength of 700 nm, the Toptical of FIG.

8A has a higher transmittance for B (blue) than that for G (green), while the color-filter pigment-dispersed type resist of FIG. 9 has a higher transmittance for G (green) than that for B (blue). Further, both of them have a higher transmittance for R (red) than those for G (green) and B (blue), at the wavelength 700 nm.

Further, when repairing is performed on defective portions (non-uniform pixels, extinct points) which have been detected according to the aforementioned method, the repairing is influenced by the spectral transmittance characteristics of the color filters. This is because, when laser is directed thereto, the transmittance characteristics are largely varied, depending on whether the defective portions exist on redfilter pixels, green-filter pixels, or blue-filer pixels. For example, in cases where the laser wavelength is a YAG twofold wavelength (532 nm), even when the transmittance characteristics of the color filters are as the characteristic of FIG. 9, their transmittance for G (green) is higher than those for R (red) and B (blue). Accordingly, referring to the characteristics of FIGS. 8A and 8B, the laser passed through the green color filter has higher intensity, but the laser passed through the red-color filter and the laser passed through the blue-color filter have lower intensity. Further, the green color filter absorbs a smaller amount of laser, while the red color filter and the blue color filter absorb larger amounts of laser.

SUMMARY OF THE INVENTION

However, with the conventional method, it is hard to comprehensively perform investigations at high speeds, due to the differences in intensity and focal point of leak light among the types of color filters, since red, green, and blue color filters have different light transmission characteristics. In addition thereto, color filters of different types absorb and pass different amounts of laser light to be used in repairing depending on the types of color filters, thus, the filters of different types have variations in degree of difficulty of repairing, depending on the types of color filters.

Therefore, it is an object of the present invention to provide an organic EL device with filters and a method of repairing the same which are capable of overcoming the aforementioned problems in the related art and, further, capable of reducing variations in conditions for leak-light transmission during leak-light detection and in conditions for transmission of laser light to be used for repairing, depending on respective types of filters.

An organic electro-luminescence (EL) device with a filter according to the present invention includes;

a first electrode in a side for extraction of light to outside;
a second electrode placed oppositely to the first electrode;
an electro-luminescence layer placed between the first electrode and the second electrode;
a filter provided on a surface of the first electrode, the surface of the first electrode being opposite to another surface of the first electrode facing to the electro-luminescence layer, wherein the filter transmits light in a certain-wavelength range out of the range of 400 nm to 700 nm; and
a certain-wavelength absorption film placed between the filter and the electro-luminescence layer and is adapted, wherein the certain-wavelength absorption film has a transmittance for light in the certain-wavelength range out of the range of 400 nm to 700 nm lower than its transmittance for light with wavelengths of 400 nm to 700 nm, wherein the certain-wavelength absorption film is adapted to absorb light in the certain-wavelength range.

Further, a method of repairing an organic EL device with a filter according to the present invention is a method of repairing an organic EL device with a filter including a first electrode in a side for extraction of light to outside, a second electrode placed oppositely to the first electrode, an EL layer placed between the first electrode and the second electrode, a filter provided on a surface of the first electrode, the surface of the first electrode being opposite to another surface of the first electrode facing to the electro-luminescence layer, wherein the filter transmits light in a certain-wavelength range out of the range of 400 nm to 700 nm, and a certain-wavelength absorption film placed between the filter and the EL layer, wherein the certain-wavelength absorption film has a transmittance for light in the certain-wavelength range out of the range of 400 nm to 700 nm lower than its transmittance for light with wavelengths of 400 to 700 nm, wherein the certain-wavelength absorption film is adapted to absorb light in the certain-wavelength range, the method including: detecting a portion where leak light is generated from the EL layer as a result of application of a voltage between the first electrode and the second electrode; and directing, to the leak-light generating portion which has been detected, laser light with a wavelength out of the range of 400 to 700 nm but within the certain-wavelength range for which the certain-wavelength absorption film has a transmittance for light in the certain-wavelength range out of the range of 400 nm to 700 nm lower than its transmittance for light with wavelengths of 400 to 700 nm, for repairing the leak-light generating portion.

According to the present invention, it is possible to perform leak light detection and repairing laser processing which are less influenced by the respective types of color filters.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Figure 1:
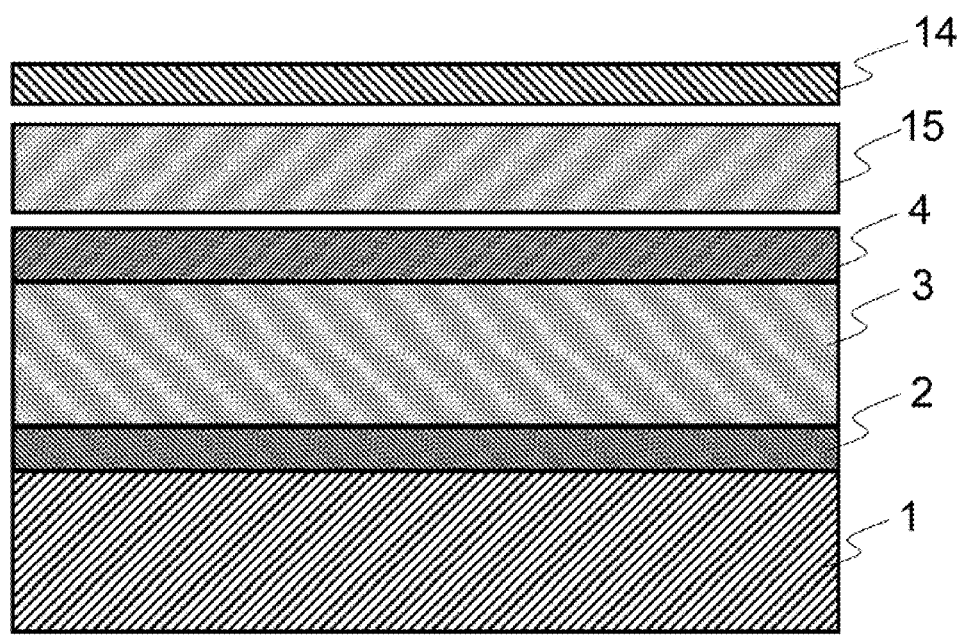
FIG. 1 is a schematic cross-sectional view illustrating the structure of an organic EL display according to a first embodiment of the present invention.

Hereinafter, an organic EL device and a method for repairing the same according to an embodiment of the present invention will be described, with reference to the accompanying drawings. Further, in the description of the embodiment of the present invention, the same structures will be designated by the same reference characters and will not be described redundantly.

First Embodiment (Organic EL Display)

FIG. 1 is a schematic cross-sectional view illustrating the structure of an organic EL display according to a first embodiment of the present invention. In FIG. 1, the organic EL display includes a glass substrate 1, an anode 2 which is a transparent electrode, an EL layer 3, a cathode 4 which is a reflection electrode in which these respective components are formed on the glass substrate 1 in the mentioned order. The EL layer 3 contains an organic compound having the function of emitting light by being supplied with a voltage or by being supplied with external energy such as UV light. Further, the EL layer 3 emits light in any light-emission color, such as red, green, and blue colors, by being supplied with external energy. In addition thereto, there is provided a certain-wavelength transmission color filter 14 used for improving the color-creation ability of the display. Further, there is provided a certain-wavelength absorption film 15 between the cathode 4 and the certain-wavelength transmission color filter 14. As described above, the organic EL display 16 according to the present embodiment is structured.

In the organic EL display according to the first embodiment, the certain-wavelength absorption film 15 has such a characteristic that its transmittance within a certain-wavelength range out of the visible-light range (400 nm to 700 nm) is lower than its transmittance for wavelengths (400 nm to 700 nm) of visible light. Further, the certain-wavelength absorption film transmits, therethrough, leak light which is generated from the EL layer as a result of application of a voltage between the anode and the cathode. For example, leak light further falls within a wavelength range of 700 nm or longer wavelengths and, therefore, in cases of detecting leak light in the wavelength range of 700 nm or longer wavelengths, the certain-wavelength absorption film 15 is required to have a property of transmission for leak light with wavelengths of 700 nm or longer wavelengths. Thus, leak light passes through the certain-wavelength absorption film 15 for detecting defective portions. Thereafter, by detecting laser light in the certain-wavelength range, out of the visible-light range, to the certain-wavelength absorption film 15 at defective portions where leak light has been detected, it is possible to cause the certain-wavelength absorption film 15 to absorb the laser light, thereby repairing the periphery of the heated certain-wavelength absorption film 15.

There are three types of structures as described above in association with red-filter pixels (R), green-filter pixels (G), and blue-filter pixels (B) used in the organic EL display 16 according to the present embodiment. More specifically, for a red-filter pixel (R), there are provided an anode (the red-filter pixel) 2R, an EL layer (the red-filter pixel) 3R, a cathode (the red-filter pixel) 4R, a certain-wavelength transmission color filter (the red-filter pixel) 14R, and a certain-wavelength absorption film (the red-filter pixel) 15R. Further, for a green-filter pixel (G), there are provided an anode (the green-filter pixel) 2G, an EL layer (the green-filter pixel) 3G, a cathode (the green-filter pixel) 4G, a certain-wavelength transmission color filter (the green-filter pixel) 14G, and a certain-wavelength absorption film (the green-filter pixel) 15G. Further, for a blue-filter pixel (B), there are provided an anode (the blue-filter pixel) 2B, an EL layer (the blue-filter pixel) 3B, a cathode (the blue-filter pixel) 4B, a certain-wavelength transmission color filter (the blue-filter pixel) 14B, and a certain-wavelength absorption film (the blue-filter pixel) 15B.

With the organic EL display according to the present first embodiment, it is possible to perform leak light detection and repairing laser processing which are less influenced by the respective types of the certain-wavelength transmission color filters 14, using the aforementioned certain-wavelength absorption films 15.

(Repairing Apparatus)

Next, a repairing apparatus for the organic EL display in FIG. 1 will be described, with reference to FIG. 2 and FIG. 3. Further, in this case, the repairing the organic EL display includes leak light detection and repairing laser processing for defective portions.

Figure 2:
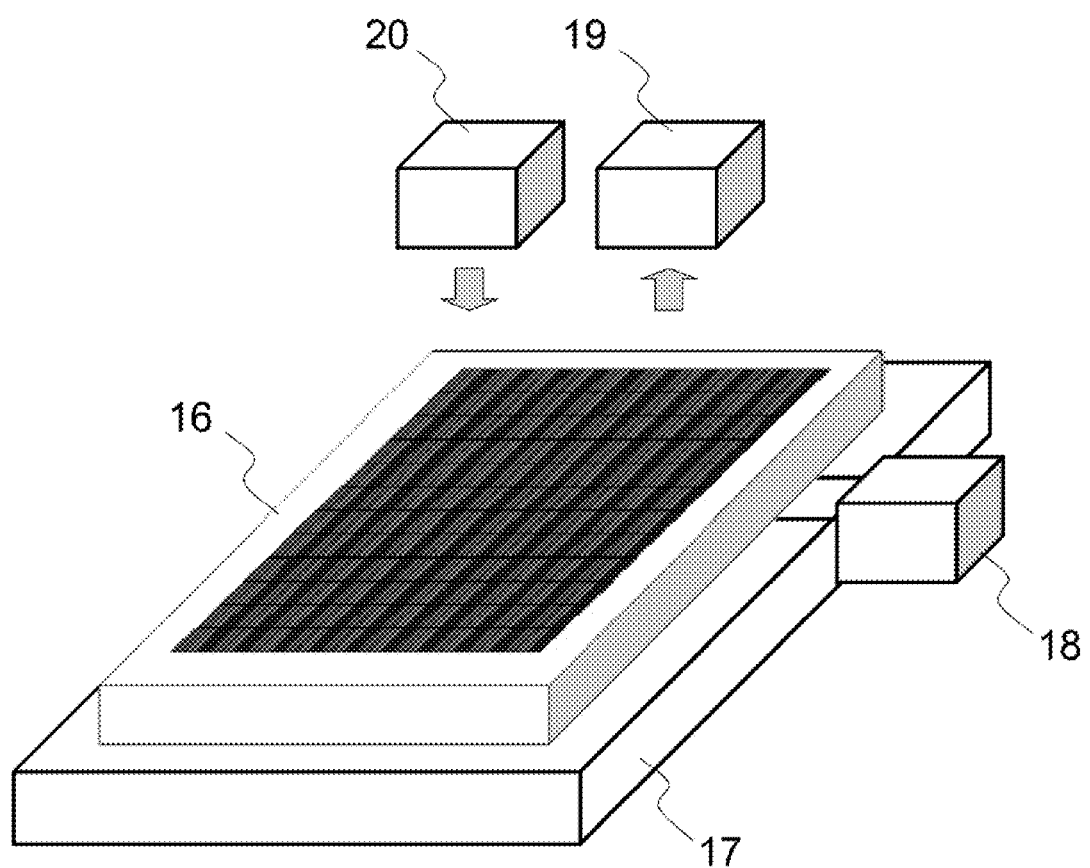
FIG. 2 is a schematic view of the structure of a repairing apparatus for an organic EL display according to the first embodiment.

FIG. 2 is a schematic view of the structure of the repairing apparatus for the organic EL display according to the first embodiment. The repairing apparatus for the organic EL display according to the first embodiment includes a movement mechanism 17, voltage application unit 18, a light-ray detection unit with a wavelength of 700 nm or longer wavelengths, and an out-of-visible-range wavelength laser irradiation unit 20. In FIG. 2, the organic EL display 16 provided with the certain-wavelength transmission color filters is placed on the movement mechanism 17 and is moved on the movement mechanism 17. The voltage application unit 18 applies a voltage to the organic EL display 16. The light-ray detection unit 19 with the wavelengths of 700 nm or longer wavelengths detects light rays with wavelengths of 700 nm or longer wavelengths. The out-of-visible-range wavelength laser irradiation unit 20 directs laser with a wavelength other than visible-light wavelengths (400 nm to 700 nm).

Figure 3:
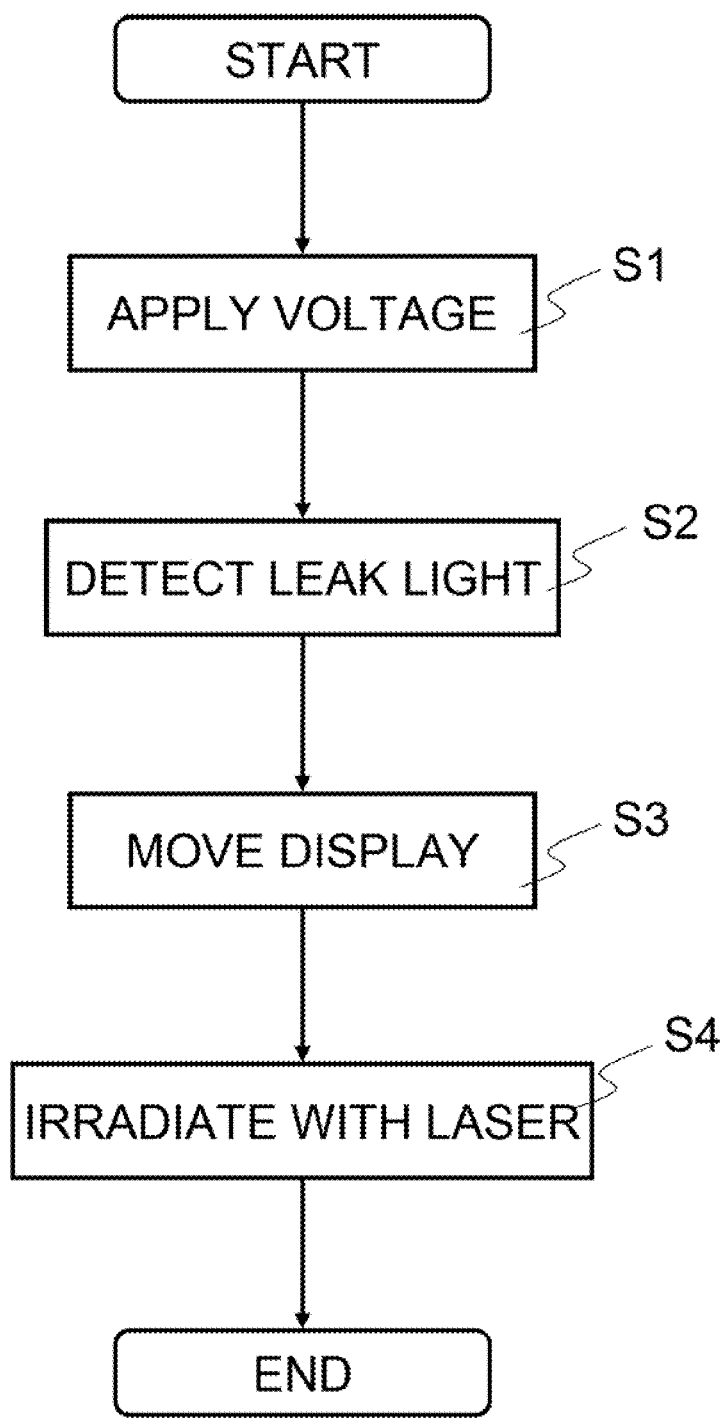
FIG. 3 is a flow chart of a method for repairing an organic EL display according to the first embodiment.

FIG. 3 is a flow chart of a method for repairing the organic EL display according to the first embodiment.

(a) Referring to FIG. 3, at first, a reverse-bias voltage is applied to the organic EL display 16 from the voltage application unit 18 (Step S1).

(b) Subsequently, leak light with wavelengths of 700 nm or longer wavelengths which is generated from the organic EL display 16 as a result of the application of the reverse-bias voltage thereto is detected by the light-ray detection unit 19 with the wavelengths of 700 nm or longer wavelengths (Step S2).

(c) Subsequently, while the organic EL display 16 is moved by the movement mechanism 17, the leak light detection in the step S2 is performed over the entire surface of the display for performing an investigation for determining portions where leak light is generated (namely, defective portions). Further, when a leak-light generating portion has been determined, the organic EL display 16 is moved using the movement mechanism 17, such that the leak-light generating portion is coincident with the optical axis of the laser light from the out-of-visible-range wavelength laser irradiation unit 20 (Step S3).

(d) Subsequently, laser light with a certain wavelength out of the range of 400 nm to 700 nm is applied from the out-of-visible-range wavelength laser irradiation unit 20 to the leak-light generating portion for performing a repair on the leak-light generating portion (Step S4).

The method for repairing the organic EL display according to the present first embodiment employs, as the certain-wavelength absorption films 15, those having such a characteristic that their transmittance within the certain-wavelength range out of the visible-light range (400 nm to 700 nm) is lower than their transmittance for wavelengths (400 nm to 700 nm) of visible light. Accordingly, by irradiation of laser light in the certain-wavelength range out of the visible light range, it is possible to cause the certain-wavelength absorption films 15 to absorb the laser light, thereby repairing the peripheries of the heated certain-wavelength absorption films 15.

In this case, when the certain-wavelength absorption film 15 may absorb light with near-infrared wavelengths in a certain-wavelength range of 1000 nm or longer wavelengths, it is necessary to employ a near-infrared wavelength such as 1064 nm, as the wavelength of the repairing laser light. Further, when the certain-wavelength absorption film 15 may absorb light with UV wavelengths in a certain-wavelength range of 400 nm or shorter wavelengths, it is necessary to employ a UV wavelength such as 355 nm or 266 nm. The reason for using such wavelengths will be described later.

Further, in cases where the characteristics of the certain-wavelength absorption films 15 for the pixels for the three colors (the red color, the green color and the blue color) are coincident with one another in the wavelength range of 700 nm to 1000 nm, by setting the wavelength range of the leak light detection by the light-ray detection unit 19 with the wavelengths of 700 nm or longer wavelengths to be the wavelength range of 700 nm to 1000 nm, instead of a range of 700 nm or longer wavelengths, it is possible to perform leak light detection which is not influenced by the difference among the certain-wavelength transmission color filters 14 of the respective color types. Further, regarding the lower limit value of 700 nm, this lower limit value is set to be a shortest wavelength which should be at least ensured by the certain-wavelength transmission color filters 14, in the longer-wavelength side thereof. Further, the wider the detectable wavelength range of the wavelength light-ray detection unit 19 with the wavelengths of 700 nm or longer wavelengths, the larger the total amount of leak light, which is advantageous. However, this relates to the cost performance of the light-ray detection unit 19 with the wavelengths of 700 nm or longer wavelengths and to the wavelength of the out-of-visible-range wavelength laser irradiation unit 20 and, therefore, the actual application thereof should be adapted in consideration of the balance thereamong, including the detection time. For example, by employing a combination of an optical filter capable of absorbing and attenuating wavelengths shorter than 700 nm and a CCD camera with sensitivity for up to near-infrared rays, it is possible to realize the light-ray detection unit 19 with the wavelengths of 700 nm or longer wavelengths with lower cost. Further, the sensitivity limit in the longer wavelength side is determined by quantum properties of the CCD camera for respective wavelengths, since a normal CCD camera has lower sensitivity for longer wavelengths in the near-infrared range.

(The Method for Repairing Through Laser Light Irradiation)

Hereinafter, the method for repairing through laser light irradiation will be described.

In performing repairing, referring to FIG. 1, irradiation of laser light from the out-of-visible-range wavelength laser irradiation unit 20 is performed in such a way as to target any of the certain-wavelength absorption film 15, the cathode 4, the EL layer 3, and the anode 2. In this case, the certain-wavelength absorption film 15 has a property of being prone to absorb the laser light directed thereto and, therefore, the certain-wavelength absorption film 15 absorbs the laser light in the certain-wavelength range and, thus, the certain-wavelength absorption film 15 generates heat. This heat is utilized for performing processing on any of the combinations of the cathode 4 (Pattern 1), the cathode 4, and the EL layer 3 (Pattern 2), the cathode 4, the EL layer 3, and the anode 2 (Pattern 3). This enables repairing defective portions.

Further, by performing control in such a way as to perform processing on the aforementioned patterns 1 to 3 while preventing the layers thereabove and thereunder from being processed, it is possible to perform a repair with higher accuracy. In order to achieve the repair with higher accuracy, it is desirable to properly adjust parameters and the like for the laser processing and the fabrication apparatus and to optimize the thickness of the certain-wavelength absorption film 15. Further, although the optimum value of the thickness of the certain-wavelength absorption film 15 is varied depending on factors, such as the pulse width, the power and the wavelength of the laser light from the out-of-visible-range wavelength laser irradiation unit 20, and processing characteristics of the certain-wavelength absorption film 15, it is possible to employ the focal depth of the out-of-visible-range wavelength laser irradiation unit 20, as one index of the thickness thereof.

Here, it is assumed that the light-condensing unit of the out-of-visible-range wavelength laser irradiation unit 20 employs a microscope-intended objective lens. On the assumption that the focal depth of only the objective lens is determined according to a general formula of ±(the wavelength/(2×the second power of the objective-lens numerical aperture)) and, also, the numerical aperture thereof is 0.4, for example, the focal depth is ±3.3 micrometers for a wavelength of 1064 nm, and the focal depth is ±1.1 micrometers for a wavelength of 355 nm. On the other hand, in the organic EL display 16, the distance L between the anode 2 and the cathode 4 is at a level of about 1 micrometer, which is closer thereto in terms of order. The sum of the distance between the anode 2 and the cathode 4 and the thickness of the certain-wavelength absorption film 15 is the targeted to-be-processed thickness for the aforementioned (Pattern 3). In consideration of the focal depth of the laser light as an index, and, also, in consideration of the pulse width, the power, and the wavelength of the laser light from the out-of-visible-range wavelength laser irradiation unit 20, and the processing characteristics of the certain-wavelength absorption film 15, by determining the correlation thereamong, it is possible to perform optimization for attaining repair with higher accuracy.

(Regarding the Certain-Wavelength Absorption Films)

Hereinafter, the certain-wavelength absorption films 15 will be described, in detail. At first, in order to describe characteristics of the certain-wavelength absorption films 15, their transmission characteristics for respective wavelengths will be studied.

Figure 4A:
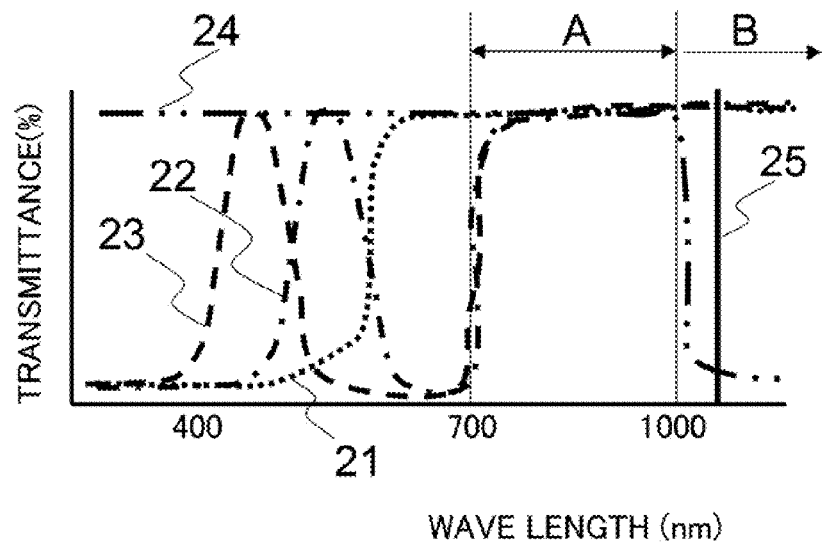
FIG. 4A is a view illustrating transmission characteristics of color filters having certain wavelength ranges of 1000 nm or longer wavelengths according to the first embodiment.
Figure 4B:
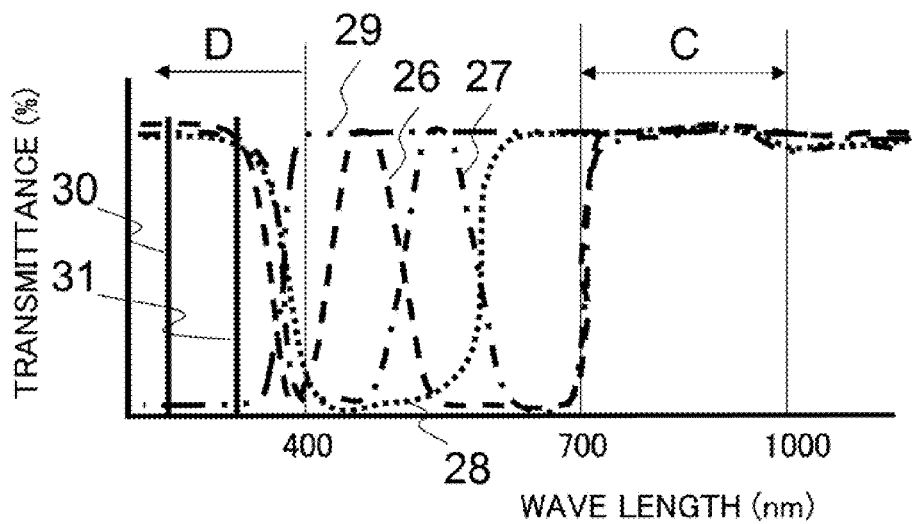
FIG. 4B is a view illustrating transmission characteristics of color filters having certain wavelength ranges of 400 nm or shorter wavelengths according to the first embodiment.

FIG. 4A is a view illustrating transmission characteristics of color filters having certain wavelengths of 1000 nm or longer wavelengths according to the first embodiment, and FIG. 4B is a view illustrating transmission characteristics of color filters having certain wavelengths of 400 nm or shorter wavelengths according to the first embodiment.

In FIG. 4A, respective lines represent a red color filter transmission wavelength characteristic 21 about near-infrared transmission, a green color filter transmission wavelength characteristic 22 about near-infrared transmission, a blue color filter transmission wavelength characteristic 23 about near-infrared transmission, a transmission wavelength characteristic 24 of an absorption film having a certain wavelength of 1000 nm or longer wavelengths, and a 1064 nm YAG fundamental wave 25. Further, an area A represents a leak-light detection wavelength range, and an area B represents a repairing laser irradiation wavelength range.

In FIG. 4B, respective lines represent a red color filter transmission wavelength characteristic 26 about near-infrared transmission, a green color filter transmission wavelength characteristic 27 about near-infrared transmission, a blue color filter transmission wavelength characteristic 28 about near-infrared transmission, a transmission wavelength characteristic 29 of an absorption film having a certain wavelength which is an UV wavelength, a 266-nm YAG fourfold wave 30, and a 355-nm YAG threefold wave 31. Further, an area C represents a leak-light detection wavelength range, and an area D represents a repairing laser irradiation wavelength range.

In the present embodiment, the certain-wavelength absorption films 15 for absorbing near-infrared wavelengths of 1000 nm or longer wavelengths as illustrated in FIG. 4A are employed. Namely, the films having a property of absorption for near-infrared wavelengths of 1000 nm or longer wavelengths are employed as the certain-wavelength absorption film (the red-filter pixels) 15R, the certain-wavelength absorption film (the green-filter pixels) 15G, and the certain-wavelength absorption film (the blue-filter pixels) 15B.

In the present embodiment, in considering leak light generated from the EL layer (the red-filter pixels) 3R, the EL layer (the green-filter pixels) 3B and the EL layer (the blue-filter pixels) 3B in the case of the presence of defective pixel, as illustrated in FIG. 4A, light in the range of 700 to 1000 nm passes through the certain-wavelength transmission color filters 14 and the certain-wavelength absorption films 15 for all the colors (the red color, the green color, and the blue color). If the transmittances for the all the colors are the same in the wavelength range of 700 to 1000 nm, the intensities and the spectra of leak light for all the colors are equal to one another.

In considering the wavelength range of 1000 nm or longer wavelengths, for example, for the 1064-nm YAG fundamental wave 25, as illustrated in FIG. 4A, the color-filter transmission wavelength characteristics 21 to 23 about near-infrared transmission exhibit higher transmittances, but the transmission wavelength characteristic 24 of the absorption film with a wavelength of 1000 nm or longer wavelengths (corresponding to the certain-wavelength absorption films 15) exhibits a lower transmittance.

On the other hand, with reference to FIG. 4B, there will be described a case where the certain-wavelength absorption film 15 may absorb UV wavelengths of 400 nm or shorter wavelengths.

At first, in cases where there is a defective portion, when leak light generated from the EL layers 3 is detected, light within the range of 700 nm to 1000 nm pass through the certain-wavelength transmission color filters 14 and the certain-wavelength absorption films 15, without dependence of the respective types of the certain-wavelength transmission color filters 14, as illustrated in FIG. 4A. If the certain-wavelength transmission color filters 14 of all the types have the same transmittance in the range of 700 nm to 1000 nm, this results in the same intensity and the same spectrum of leak light in the wavelength range of 700 nm to 1000 nm. Further, in the UV-wavelength range of 400 nm or longer wavelengths, as illustrated in FIG. 4B, for example, for the YAG threefold wave 31 and the YAG fourfold wave 30, the certain-wavelength transmission color filters 14 exhibit higher transmittances, but the certain-wavelength absorption films 15 exhibit a lower transmittance.

Hereinafter, there will be described the definition of "transmitting light with a certain wavelength" through the certain-wavelength transmission color filters 14 and the certain-wavelength absorption films 15.

Figure 8A:
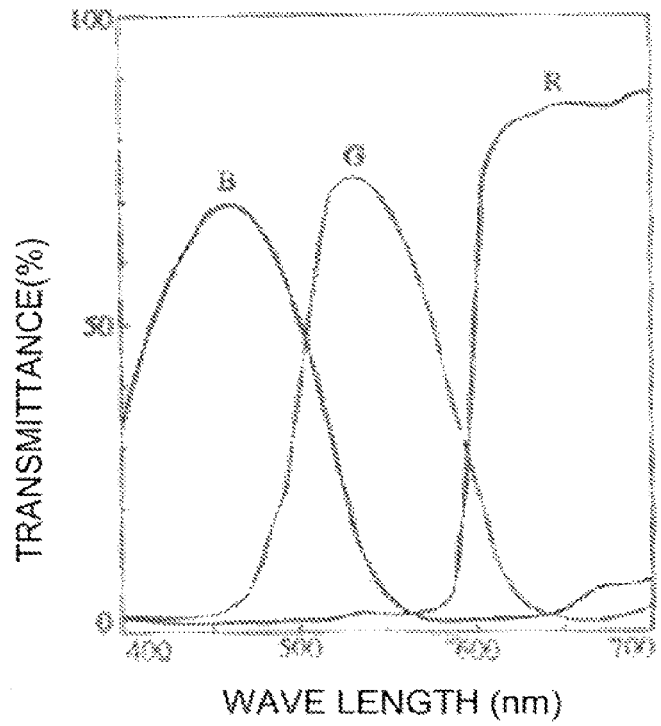
FIG. 8A is a view illustrating a spectral transmittance characteristic of Toptical as shown in "'94 Market of Liquidcrystal Display Peripheral Materials and Chemicals", CMC Corporation, Jun. 20, 1994 (the first printing published)
Figure 8B:
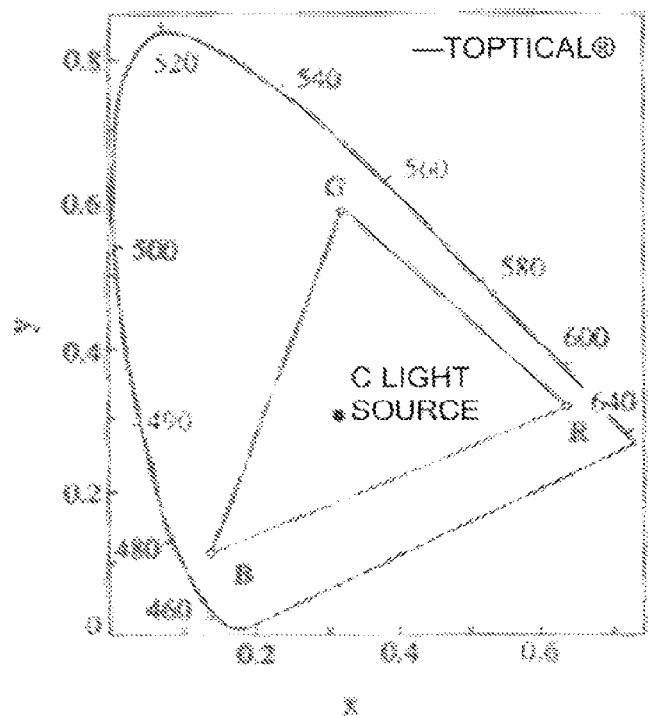
FIG. 8B is a view illustrating a CIE chromaticity of Toptical as shown in "'94 Market of Liquid-crystal Display Peripheral Materials and Chemicals", CMC Corporation, Jun. 20, 1994 (the first printing published)
Figure 9:
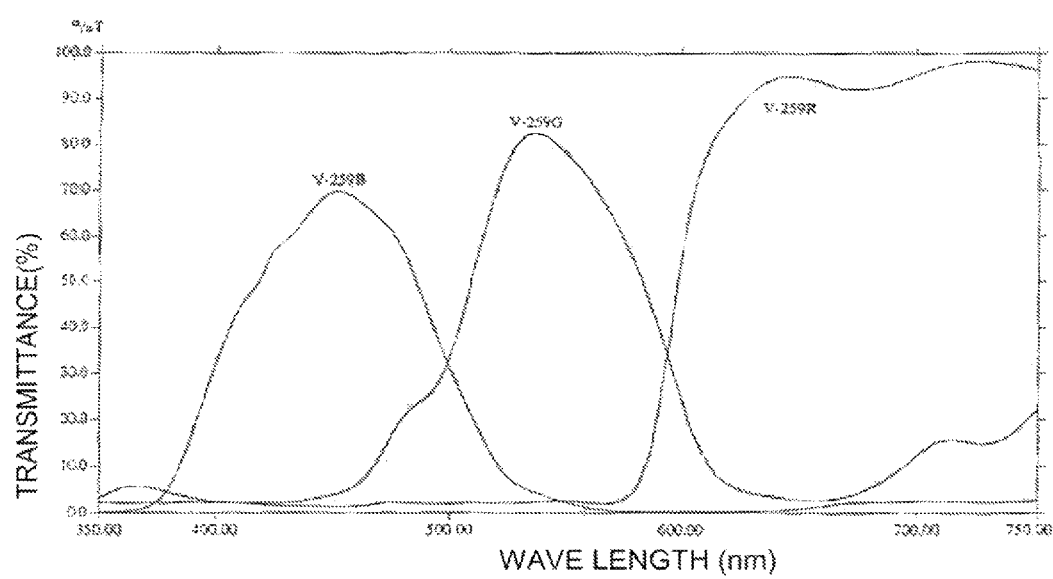
FIG. 9 is a view illustrating a spectral transmittance characteristic of a color-filter pigment-dispersed type resist as shown in "'94 Market of Liquid-crystal Display Peripheral Materials and Chemicals", CMC Corporation, Jun. 20, 1994 (the first printing published)1.

With reference to FIGS. 8A, 8B and FIG. 9, the transmittances of actual color filters will be described. A reference will be made to their transmittances at the shortest wavelength of 700 nm which should be at least ensured by the certain-wavelength transmittance color filters 14 at the longer-wavelength side thereof. In this case, their transmittances for a red color (R) are higher, but their transmittances for a green color (G) and a blue color (B) are lower. With reference to a graph in FIG. 8A, it can be understood that their transmittances for both the green color (G) and the blue color (B) at 700 nm are 10% or less, and with reference to a graph in FIG. 9, it can be understood that their transmittances for both the green color (G) and the blue color (B) at 700 nm are substantially 15% or less. These facts indicate that if the product of the transmittances of the certain-wavelength transmission color filter 14 and the certain-wavelength absorption film 15 is lower than 15%, this results in a lower transmittance.

On the other hand, when they have transmittances exceeding the aforementioned transmittances with a significant difference therebetween, they allow transmittance therethrough. For example, when the certain-wavelength transmission color filter 14G has a transmittance of 50%, and the certain-wavelength absorption film 15G has a transmittance of 50% for 700 nm, the product of them is 25%. In considering that each of them has the transmittance of 50%, which can be considered to be enough to allow transmittance therethrough, regarding the product of the transmittance values of the two filters which exceeds the transmittance 15% with a significant difference therebetween, the definition of "transmitting a certain wavelength" is never considered to be a non-realistic definition. Furthermore, it goes without saying that this definition cannot be applied to the color filters represented in FIGS. 8A, 8B and FIG. 9. When the certain-wavelength transmission color filters 14 and the certain-wavelength absorption films 15 have lower transmittances in the specified wavelengths range in order to enable laser irradiation which will be described later, as a matter of course, the above definition of the product of their transmittances cannot be applied to the specified wavelengths range.

(The Structure of Three Pixels for RGB)

Hereinafter, there will be given a supplemental description of the structure of three pixels for RGB in the structure according to the present embodiment.

Figure 5:
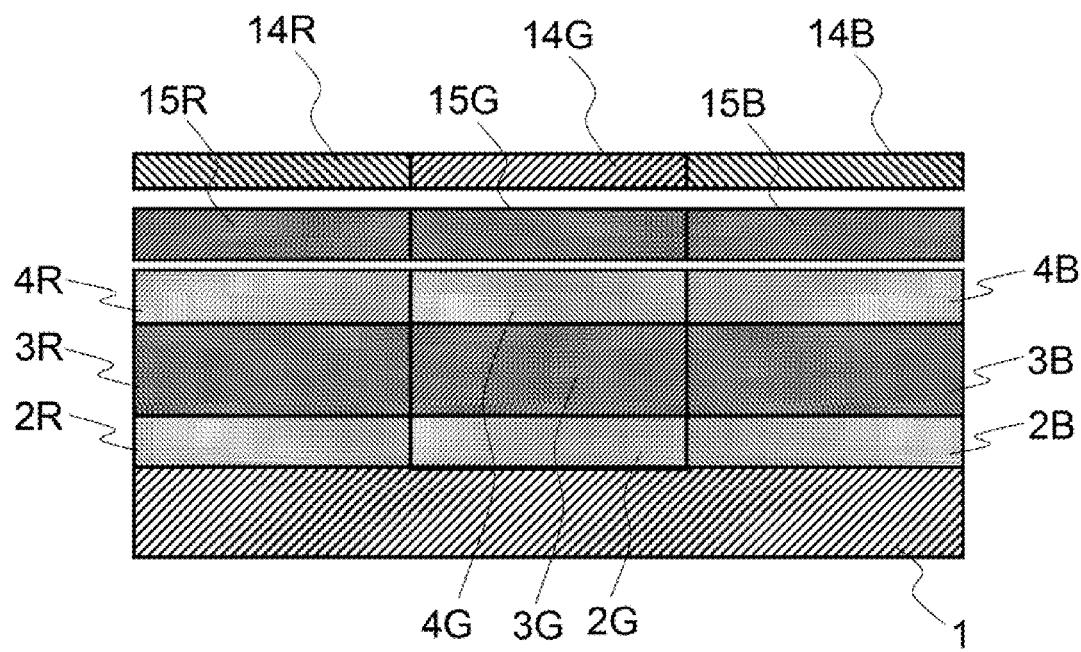
FIG. 5 is a schematic cross-sectional view of the structure of three pixels for RGB according to the first embodiment.
Figure 6:
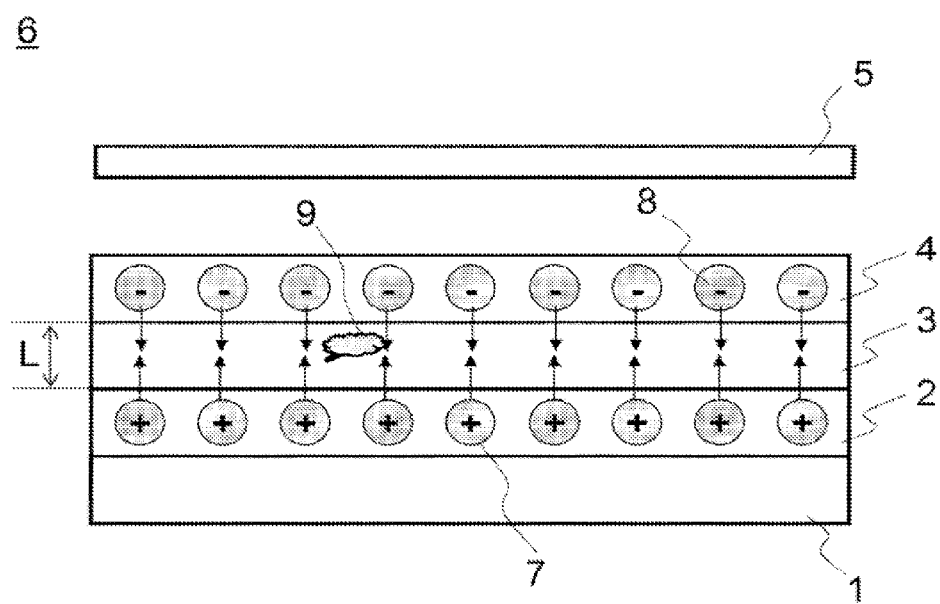
FIG. 6 is a schematic view illustrating the structure of a conventional organic EL display.
Figure 7:
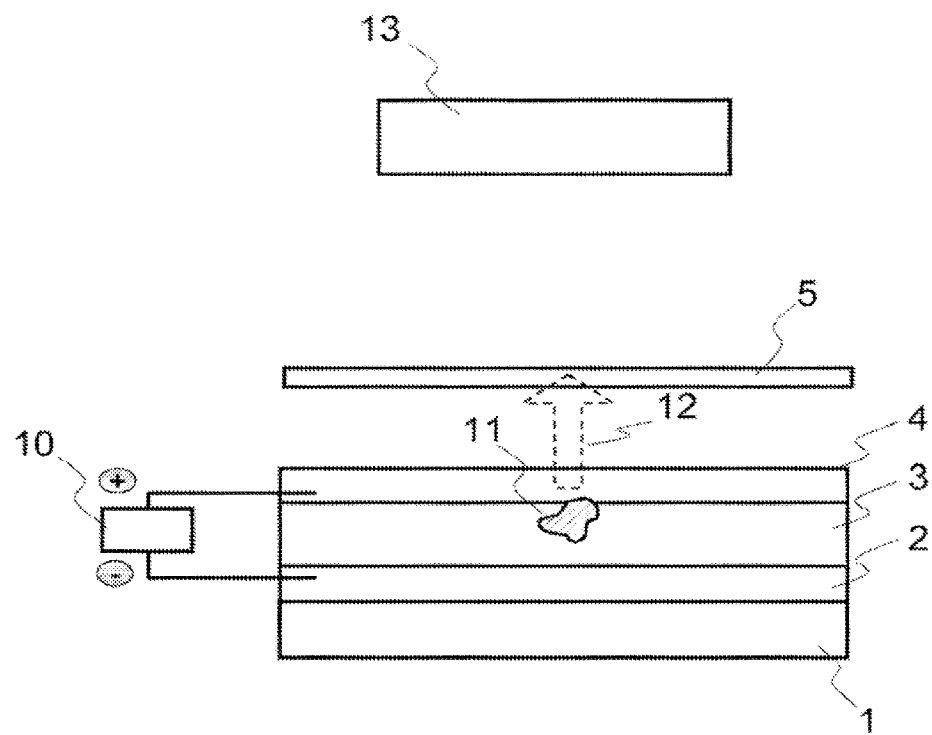
FIG. 7 is a conceptual view of weak leak light detection through conventional color filters.

FIG. 5 is a schematic enlarged view of the structure of three pixels for RGB according to the first embodiment. As illustrated in FIG. 5, there is the same structure as that in FIG. 1 which has been described above, in association with each of RGB (red, green and blue colors). Here, the structures of partition walls and the like are not illustrated for simplification, but structures as illustrated in FIG. 5 are formed over the entire display surface to form the organic EL display 16 according to the present embodiment.

Further, while in the aforementioned description, an organic EL display has been described as an example of an organic EL device, the present invention is considered to be applicable to any organic EL devices with filters. For example, the present invention is considered to be applicable to organic EL illuminations which are constituted by a cathode, an EL layer, a transparent anode, and a transparent substrate and have color filters.

Further, the certain-wavelength absorption films 15 according to the present embodiment can be formed by applying a coating and the like to the side of the cathodes 4 which is closer to the certain-wavelength transmission color filters 14.

Further, although there is a need for conducting studies about various conditions, it is also possible to provide the certain-wavelength absorption films 15 according to the present embodiment on the side of the cathodes 4 which is closer to the EL layers 3.

Further, while in the present embodiment, the anodes 2R, 2G, and 2B and the cathodes 4R, 4G, and 4B have been described by providing respective reference characters thereto, the present invention is also applicable to cases where the anodes or the cathodes are formed from a single structure.

Further, while in the present embodiment, the certain-wavelength transmission color filters 14 have been described as being for a red color (R), a green color (G), and a blue color (B), they can be a cyan, a magenta, and a yellow. Also, two or more types of filters can be employed in combination with one another.

Further, while in the present embodiment, the certain-wavelength absorption films 15 are adapted such that their transmittances for wavelengths other than visible light are lower than their transmittances for visible light wavelengths, they can be also adapted such that their transmittances for light other than leak light generated as a result of the application of a reverse-bias voltage to the anodes and the cathodes may be zero in a wavelength range out of visible-light range. In this case, only visible light and leak light can pass therethrough, but repairing can be performed at higher speeds, although there is a possibility of degradation of the display quality of the organic EL display.

Further, while in the present embodiment, leak light is emitted by applying a reverse-bias voltage, it is also possible to emit leak light by applying a positive bias voltage. Further, in this case, it is necessary to apply a positive bias voltage which is low enough not to cause the EL films for the respective colors to emit light in their inherent colors.

With the present invention, it is possible to perform leak light detection and repairing laser irradiation which are less influenced by the respective types of color filters. Accordingly, the present invention can be applied to cases where defects of an organic EL film should be detected and repaired at high speeds with high accuracy.

The invention claimed is:

1. A method of repairing an organic electro-luminescence device with a filter, the organic electro-luminescence device including a first electrode in a side for extraction of light to outside, a second electrode placed oppositely to the first electrode, an electro-luminescence layer placed between the first electrode and the second electrode, a filter provided on a surface of the first electrode, the surface of the first electrode being opposite to another surface of the first electrode facing to the electro-luminescence layer, wherein the filter is adapted to transmit, therethrough, light in a certain-wavelength range out of the range of 400 nm to 700 nm, and a certain-wavelength absorption film placed between the filter and the electro-luminescence layer, wherein the certain-wavelength absorption film has a transmittance for light in the certain-wavelength range out of the range of 400 nm to 700 nm lower than its transmittance for light with wavelengths of 400 to 700 nm, wherein the certain-wavelength absorption film is adapted to absorb light in the certain-wavelength range to generate heat, the method comprising:

detecting a portion where leak light is generated from the electro-luminescence layer as a result of application of a voltage between the first electrode and the second electrode; and directing, to the detected leak-light generating portion, laser light with a wavelength in the certain-wavelength range such that the certain-wavelength absorption film is heated by the directed laser light to repair the leak-light generating portion.

2. The method of repairing an organic electro-luminescence device with a filter according to claim 1, wherein the certain-wavelength absorption film is provided between the filter and the first electrode.

3. The method of repairing an organic electro-luminescence device with a filter according to claim 1, wherein the certain-wavelength absorption film is a film provided as a coating film applied on the surface of the first electrode.

4. The method of repairing an organic electro-luminescence device with a filter according to claim 1, wherein the certain-wavelength absorption film is adapted to transmit, therethrough, leak light generated as a result of application of a voltage between the first electrode and the second electrode.

* * * * *